United States Patent [19]

Pavlichenko

[11] 3,972,749

[45] Aug. 3, 1976

[54] SEMICONDUCTOR LIGHT SOURCE ON THE BASIS OF SILICON CARBIDE SINGLE CRYSTAL

[76] Inventor: Vadim Ivanovich Pavlichenko, ulitsa Polevaya 20/1, Kalingrad, Moskovskaya oblast, U.S.S.R.

[22] Filed: Sept. 6, 1973

[21] Appl. No.: 394,715

[30] Foreign Application Priority Data

Sept. 15, 1972 U.S.S.R. .............................. 1828718

[52] U.S. Cl. .................................. 148/33; 148/1.5
[51] Int. Cl.² .......................................... H01L 21/00
[58] Field of Search ............................... 148/33, 1.5

[56] References Cited
UNITED STATES PATENTS

| | | | |
|---|---|---|---|
| 2,937,323 | 5/1960 | Kroko | 148/33 |
| 3,030,704 | 4/1962 | Hall | 148/33 |
| 3,121,829 | 2/1964 | Huizing | 148/33 |
| 3,210,624 | 10/1965 | Williams | 148/33 |
| 3,517,281 | 6/1970 | Mlavsky | 148/33 |
| 3,577,285 | 5/1971 | Rutz | 148/1.5 |

*Primary Examiner*—Peter D. Rosenberg
*Attorney, Agent, or Firm*—Haseltine, Lake & Waters

[57] ABSTRACT

A semiconductor light source on the basis of n-type silicon carbide single crystal, wherein an epitaxial silicon carbide film of the same type is disposed on the basic single crystal, a p-n junction with a depth of 0.1–2 $\mu$m is arranged on the surface of this film, the basic silicon carbide single crystal having a concentration of uncompensated donor atoms of $5 \cdot 10^{17}$–$5 \cdot 10^{18}$ cm$^{-3}$ and a concentration of atoms of secondary impurities not greater than $2 \cdot 10^{18}$ cm$^{-3}$, while the epitaxial film has a concentration of uncompensated donor atoms of $0.8 \cdot 10^{18}$–$3 \cdot 10^{18}$ cm$^{-3}$, a concentration of atoms of secondary impurities of $0.4 \cdot 10^{17}$–$1.5 \cdot 10^{17}$ cm$^{-3}$ and a thickness of 5–100 $\mu$m.

3 Claims, 1 Drawing Figure

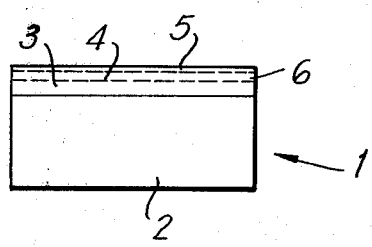

SEMICONDUCTOR LIGHT SOURCE ON THE BASIS OF SILICON CARBIDE SINGLE CRYSTAL

The invention relates to semiconductor devices, and more particularly to semiconductor light sources.

Known in the art is a semiconductor light source on the base of an electronically conductive silicon carbide single crystal, said single crystal being doped with nitrogen, and having a p-n junction that exhibits the electroluminescence over the visible spectral band, said silicon carbide having a concentration of the base uncompensated donor atoms of $0.8 \cdot 10^{18} - 5 \cdot 10^{18}$ cm$^{-3}$ and a concentration of secondary residual impurities of more than $10^{17}$ cm$^{-3}$. The structure of this semiconductor light source is formed by a p-layer doped having an acceptor impurity with a minimum activation energy and with its solubility in silicon carbide of the order of $2 \cdot 10^{18} - 2 \cdot 10^{20}$ cm$^{-3}$, a basic n-layer with a concentration of uncompensated donor atoms of $0.8 \cdot 10^{18}$ cm$^{-3}$, and a central layer of a thickness of 0.05–1.5 $\mu$m disposed therebetween, which is doped with donor- and acceptor-type luminescence agents with a concentration not greater than $0.1 \cdot 10^{18} - 2 \cdot 10^{18}$ cm$^{-3}$ and exhibits a resistivity which is greater by at least three orders of magnitude than the resistivity of the basic layer. In the known devices the basic n-layer is doped with nitrogen and oxygen.

The disadvantage of such light sources consists in relatively low uniformity of the parameters for different samples, in particular in the case of multielement devices, resulting in a low yield of suitable devices, as well as in high production cost due to the use of an expensive starting material - semiconductor silicon carbide.

It is an object of the invention to eliminate the above disadvantages.

The invention consists in the provision of a semiconductor light source having a materially improved uniformity of the basic parameters, allowing for increased yield of suitable devices and providing for the possibility of the employment of silicon carbide having a wider range of concentration of the basic and residual impurities, and in particular the employment of the abrasive silicon carbide.

This object is accomplished by that according to the invention disposed on the basic n-type silicon carbide single crystal is an epitaxial film of silicon carbide of the same conductivity type, a p-n junction being arranged in the surface of said film, the basic silicon carbide single crystal having a concentration of uncompensated donor atoms of $5 \cdot 10^{17} - 5 \cdot 10^{18}$ cm$^{-3}$, and a concentration of residual impurities atoms not greater than $2 \cdot 10^{18}$ cm$^{-3}$, while the epitaxial film has a concentration of uncompensated donor atoms of $0.8 \cdot 10^{18} - 3 \cdot 10^{18}$ cm$^{-3}$ and a concentration of residual impurities atoms of $0.4 \cdot 10^{17}$ cm$^{-3}$, with the thickness of the film being of 5–100 $\mu$m.

The invention will now be described in detail with reference to a preferred embodiment thereof illustrated by the following examples, in which reference will be made to the accompanying drawing.

The FIGURE illustrates the novel silicon carbide device of the present invention.

In accordance with the invention a semiconductor light source referred to generally as 1 comprises a basic silicon carbide single crystal 2 having a concentration of uncompensated donor atoms of $5 \cdot 10^{17} - 5 \cdot 10^{18}$ cm$^{-3}$ and a concentration of residual impurities atoms not greater than $2 \cdot 10^{18}$ cm$^{-3}$. The basic single crystal is doped with nitrogen and oxygen and is of the n-type. Disposed on the basic single crystal is an epitaxial silicon carbide n-type film 3 which has a concentration of uncompensated donor atoms of $0.8 \cdot 10^{18} - 3 \cdot 10^{18}$ cm$^{-3}$ and a concentration of residual impurities atoms of $0.4 \cdot 10^{17} - 1.5 \cdot 10^{17}$ cm$^{-3}$ and a thickness of 5–100 $\mu$m. A p-n junction 4 is arranged on the surface of the epitaxial film. A p-layer 5 offering a low ohmic resistance is alloyed with aluminium and boron and has a thickness of 0.1–2 $\mu$m.

Disposed between the p-layer and the n-layer is layer 6 of 0.1–1.5 $\mu$m offering a high ohmic resistance which is doped with boron and in which the electroluminescence takes place.

The following examples illustrate the present invention.

EXAMPLE 1

A semiconductor light source on the basis of silicon carbide single crystal comprises a starting basic silicon carbide n-type single crystal of a thickness of 310 $\mu$m with a concentration of uncompensated donor atoms (nitrogen and oxygen) of $4.5 \cdot 10^{18}$ cm$^{-3}$ and a concentration of the compensating atoms of residual secondary impurities of about $5 \cdot 10^{17}$ cm$^{-3}$. Disposed on this single crystal is an n-type monocrystalline epitaxial film having a concentration of uncompensated donor atoms (nitrogen and oxygen) of $1.5 \cdot 10^{18}$ cm$^{-3}$, a concentration of residual secondary impurities of about $0.8 \cdot 10^{17}$ cm$^{-3}$ and a thickness of 25 $\mu$m, the film having a superficial p-type layer of a thickness of 0.2 $\mu$m alloyed with aluminum in a concentration of $2 \cdot 10^{19}$ cm$^{-3}$; adjacent to that layer there is a central activated n-type layer of 0.4 $\mu$m doped with a donor impurity (nitrogen and oxygen) and an acceptor impurity (boron) in a concentration of $1.5 \cdot 10^{18}$ cm$^{-3}$.

Ohmic contacts comprise two-layer metal coatings: aluminium with the addition of 2% of titanium, and nickel and titanium, nickel being applied to the p-layer and n-layer respectively. The thickness of the spray-deposited layers of aluminium (with the addition of 2% of titanium) is of 1.5 $\mu$m, of titanium — 0.05 $\mu$m and of nickel — 0.2 –0.3 $\mu$m. The light source has a brightness of 100–200 kJ/m$^2$ with a current density of 0.5 A/cm$^2$ (current of 10 mA). A yield of suitable crystals as to the photoluminescense (after the diffusion) was of 99 percent and a yield of light sources suitable as to the electroluminescence was of 97 percent.

EXAMPLE 2

A light source based on silicon carbide comprises a starting basic silicon carbide n-type single crystal of a thickness of 350 $\mu$m doped with nitrogen and oxygen in a concentration of up to $1.0 \cdot 10^{18}$ cm$^{-3}$ and with a concentration of residual impurities of $8 \cdot 10^{17}$ cm$^{-3}$. Disposed on this crystal is a monocrystalline epitaxial electronically conductive film of a thickness of 45 $\mu$m with a concentration of uncompensated donor atoms (nitrogen and oxygen) of $1.0 \cdot 10^{18}$ cm$^{-3}$ and a concentration of residual impurities of $0.6 \cdot 10^{17}$ cm$^{-3}$, the superficial p-type layer of that film of a thickness of 0.3 $\mu$m being alloyed with aluminium with a concentration of up to $2 \cdot 10^{19}$ cm$^{-3}$; adjacent thereto is a central activated n-type layer of a 0.6 $\mu$m alloyed with a donor impurity — nitrogen and oxygen — and an acceptor impurity — boron — in a concentration of $1.0 \cdot 10^{18}$ cm$^{-3}$.

The light source has a yellow ray brightness of 160 kJ/m² with a current density of 0.5 A/cm² (current of 10 mA).

The yield of suitable crystals as to the photoluminescence (after the diffusion) was of 95 percent, while the yield of the light sources suitable as to the electroluminescence was of 90 percent.

The method of manufacturing the semiconductor light sources based on silicon carbide according to the invention is based upon known methods of manufacturing monocrystalline epitaxial silicon carbide layers, as well as upon the methods of separate diffusion of aluminium and boron into silicon carbide, and this method is illustrated by Examples 3 and 4.

EXAMPLE 3

The hexagonal modification of epitaxial monocrystalline n-type silicon carbide films were grown upon basic silicon carbide n-type single crystals at 1750°C in the argon atmosphere. The concentration of uncompensated donor atoms (nitrogen atoms) in the starting basic crystals was of $1.5 \cdot 10^{18} - 5 \cdot 10^{18}$ cm$^{-3}$, while the concentration of residual (residual) impurities was of $(3-8) \cdot 10^{17}$ cm$^{-3}$. Epitaxial films deposited on these crystals had a concentration of uncompensated donor atoms (nitrogen and oxygen) of $1.1 \cdot 10^{18} - 2.2 \cdot 10^{18}$ cm$^{-3}$ and a concentration of residual impurities of $0.6 \cdot 10^{17} - 1.0 \cdot 10^{17}$ cm$^{-3}$.

The semiconductor light source described in Example 1 was manufactured on the basis of the above-mentioned silicon carbide single crystal with the epitaxial film by the method of separate diffusion thereinto from a gaseous phase first of aluminium at 2150°C for 3.5 hours in the argon atmosphere under a pressure of about 2 atm, and then of boron at 1920°C for 3 minutes in the argon atmosphere under a pressure of about 2 atm. Dysprosium oxide and silicon monoxide were added to aluminium in an amount of 0.3 g and 1 g respectively at the first stage of the separate diffusion — during the aluminium diffusion (the process was performed with 350 crystals of silicon carbide at the same time).

After the above-described diffusion and upon the formation of the p-zone in 95 percent of the crystals having epitaxial films, a uniform and bright photoluminescence was observed with a brightness by 1.5–3 times higher than the brightness of photoluminescence normally obtained with the standard crystals, with a yield of the latters as to the photoluminescence averaging to only 50–65 percent. An ohmic aluminium contact with the addition of 2 percent of titanium and with a thickness of 1.5 μm was spray-deposited in vacuum to the diffusion p-zone. The ohmic contact of the basic crystal was formed by applying by sputtering in vacuum of a two-layer coating of titanium and nickel of a thickness of 0.05 and 0.2 μm respectively. A sputtering temperature for aluminium with titanium additive was of 650°C, for titanium — 650°C and for nickel — 300°C.

After the diffusion the p-n junctions with the contacts have been cut into square pieces of 1.5 × 1.5 mm², and 86 percent of the devices exhibited uniform electroluminescence with a brightness of 80–200 kJ/m² with a current density of 0.5 A/cm² (current of 10 mA). At the same time, in the standard crystals a yield of devices suitable as to the electroluminescence and the brightness were by at least 1.5–3 times lower as compared to the devices manufactured by the above-described method.

The light sources according to the invention are very efficient from the point of view of the direct voltage drop.

At room temperature and with a current of 10 mA this voltage drop is the minimum possible for silicon carbide of 2.25–2.5 V (which is very near to the contact potential difference), this value being of 2.25–2.35 V for the majority of the devices. Thus, a scatter in the values of the direct voltage drop does not exceed 5 percent (as to the minimum value thereof) which is by at least 10–15 times lower as compared with the light sources made on the basis of the standard single crystals.

It should be emphasized that the direct voltage drop values are slightly decreased (to 2.2–2.35 V or by 2–10 percent) and increased (up to 2.4–2.8 V or by 5–20 percent) with a temperature increase up to +70°C and decrease to −60°C, that is the relative change in the direct voltage drop over the above-mentioned temperature range is also by 1.5–2 times lower than in the devices made on the basis of the standard crystals. The production cost of the devices according to the invention is by about three times lower than that of the devices made on the basis of the standard basic silicon carbide single crystals.

EXAMPLE 4

The hexagonal modification of epitaxial monocrystalline n-type silicon carbide films were grown upon basic silicon carbide n-type single crystals at 1800°C in the argon atmosphere. The concentration of uncompensated donor atoms (nitrogen atoms) in the starting crystals was of $0.8 \cdot 10^{18} - 3.5 \cdot 10^{18}$ cm$^{-3}$, while the concentration of residual impurities was of $5 \cdot 10^{17} - 8.5 \cdot 10^{17}$ cm$^{-3}$, the thickness being of 350±20 μm. Deposited on these crystals were electronically conductive monocrystalline epitaxial films of 30–50 μm with a concentration of uncompensated donor atoms (nitrogen and oxygen) of $1.0 \cdot 10^{18} - 1.6 \cdot 10^{18}$ cm$^{-3}$ and with a concentration of residual impurities of $0.4 \cdot 10^{17} - 1.2 \cdot 10^{17}$ cm$^{-3}$.

As the starting crystals the use was made of technical abrasive silicon carbide single crystals unsuitable for the manufacture of normal-grade light sources without an epitaxial film.

The semiconductor light source described in Example 2 was manufactured on the basis of the above-described silicon carbide single crystal with the n-type epitaxial monocrystalline silicon carbide film by the method of separate diffusion from a gaseous phase of first aluminium at 2200°C for 7 hours in the argon atmosphere under a pressure of about 2 atm, and then of boron at 1920°C for 5 minutes in the argon atmosphere under a pressure of about 2 atm. Dysprosium oxide and silicon monoxide were added to aluminium in an amount of 0.5 g and 1.5 g respectively, as well as to fine-crystalline silicon carbide surrounding the crystals having the epitaxial films, at the first stage of the separate diffusion, i.e. during the aluminium diffusion.

An ohmic contact of sputtered aluminium with a titanium additive (1.5 percent) of a thickness of 1 μm was deposited on the diffusion p-zone of the epitaxial film, and a layer of spray-deposited nickel of 0.3 μm was applied thereupon.

The ohmic contact of the basic crystal was formed by a two-layer coating of titanium and nickel of a thickness of 0.05 and 0.3 μm respectively. A brightness of the semiconductor light sources was of 100–200 kJ/m² with a current density of 0.5 A/cm² (current of 10 mA).

A yield of suitable light sources as to the photoluminescence was of 95 percent and a yield of the light sources suitable as to the electroluminescence was of 90 percent.

Scatter of the direct voltage drop (2.25–2.40 V or 6 percent) was by at least 3 times lower than in the devices made on the basis of the standard single crystals. The production cost of these single element light sources was by 2–3 times lower than of known light sources.

The production cost of multi element light sources on the basis of such basic single crystals was also by several times lower than in the case of making multielement devices on the basis of the standard silicon carbide single crystals.

The use of the light source on the basis of silicon carbide according to the invention permits to improve the brightness by about 1.5–2 times as compared with known light sources of this type, while the scatter of the direct voltage drop and of the brightness is reduced by 1.5–3 and 10–15 times respectively.

At the same time, the production cost of the light sources is reduced by 3–4 times as compared with the light sources made on the basis of the standard silicon carbide single crystals.

Silicon carbide light sources may be used both for visual information display and for its recording on light-sensitive materials for the purposes of the data input and output in computers, as well as in various display boards and in digital metering instruments.

What is claimed is:

1. A silicon carbide semiconductor light device capable of electroluminescence, comprising a basic silicon carbide single crystal of low resistance having uncompensated impurity atoms therein of given conductivity type, an epitaxial silicon carbide film thereon having uncompensated impurity atoms therein of said conductivity type, a first layer of low ohmic resistance having impurity atoms therein of opposite conductivity type formed in the surface of said epitaxial film, and a second layer of high ohmic resistance having impurity atoms of said opposite conductivity type and disposed between said first layer and a basic part of said epitaxial film.

2. The silicon carbide semiconductor light device according to claim 1, comprising a basic n-type silicon carbide single crystal having a concentration of uncompensated donor atoms of $5 \cdot 10^{17}$ to $5 \cdot 10^{18}$ cm$^{-3}$ and a concentration of atoms of residual impurities not greater than $2 \cdot 10^{18}$ cm$^{-3}$, said basic single crystal offering a low ohmic resistance and being doped with nitrogen and oxygen, an epitaxial n-type silicon carbide film thereon having a concentration of uncompensated donor atoms of $0.8 \cdot 10^{18}$ to $3 \cdot 10^{18}$ cm$^{-3}$, a concentration of atoms of secondary impurities of $0.4 \cdot 10^{17}$ to $1.5 \cdot 10^{17}$ cm$^{-3}$ and a thickness of 5–100 $\mu$m, a p-layer offering a low ohmic resistance doped with aluminum and boron and having a thickness of 0.1–2 $\mu$m formed in the surface of said n-type epitaxial film, and a layer doped with boron of 0.1–1.5 $\mu$m offering a high ohmic resistance which is disposed between said p-layer and the basic part of said n-type epitaxial film.

3. A device according to claim 2, wherein said concentration of uncompensated donor atoms in said basic n-type silicon carbide single crystal in $5 \cdot 10^{18}$ cm$^{-3}$, and said concentration of uncompensated donor atoms in said epitaxial n-type silicon carbide film is $2.8 \cdot 10^{18}$.

* * * * *